(12) United States Patent
Mochizuki

(10) Patent No.: US 7,430,037 B2
(45) Date of Patent: Sep. 30, 2008

(54) RETICLE CASSETTE AND EXPOSURE APPARATUS USING RETICLE CASSETTE

(75) Inventor: Shinya Mochizuki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 65 days.

(21) Appl. No.: 11/557,017

(22) Filed: Nov. 6, 2006

(65) Prior Publication Data
US 2007/0109523 A1    May 17, 2007

(30) Foreign Application Priority Data
Nov. 11, 2005    (JP) .............................. 2005-327568

(51) Int. Cl.
   *G03B 27/62* (2006.01)
   *G03B 27/42* (2006.01)
   *H01L 21/683* (2006.01)
(52) U.S. Cl. ........................... 355/75; 355/53; 361/234
(58) Field of Classification Search ................... 355/53, 355/72–76; 361/234
See application file for complete search history.

(56) References Cited

U.S. PATENT DOCUMENTS

| 5,636,098 A | * | 6/1997 | Salfelder et al. ............ 361/234 |
| 6,169,652 B1 | * | 1/2001 | Klebanoff ................... 361/234 |
| 6,781,673 B2 | * | 8/2004 | Moors et al. ................. 355/76 |
| 2005/0095829 A1 | | 5/2005 | Shinichi |

FOREIGN PATENT DOCUMENTS

JP    2005-123292    5/2005

* cited by examiner

*Primary Examiner*—Hung Henry Nguyen
(74) *Attorney, Agent, or Firm*—Canon U.S.A. Inc I.P. Div

(57) ABSTRACT

A reticle cassette includes a bearing portion and a cover, a reticle being disposed on the bearing portion and accommodated in a space between the bearing portion and the cover. The bearing portion includes electrodes for attracting using an electrostatic force and supporting a first surface of the reticle, the first surface having a pattern being formed thereon.

8 Claims, 10 Drawing Sheets

RETICLE CASSETTE AND EXPOSURE APPARATUS USING RETICLE CASSETTE

BACKGROUND OF THE INVENTION

1. Field of the Invention

The present invention relates to reticle cassettes for carrying reticles (photomasks) in exposure apparatuses that use extreme ultraviolet (EUV) rays as a light source for exposure.

2. Description of the Related Art

Reticles are used for transferring desired patterns onto wafers in exposure apparatuses. Particles existing on the pattern surfaces of the reticles prevent high-precision exposure, and as a result, lead to defects of devices in some cases.

To solve this problem, reticles are carried while the pattern surfaces thereof are covered with transparent protective films, and the reticles are used for exposure while being covered with the protective films in known exposure apparatuses.

On the other hand, wavelengths of exposure lights have been shortened in recent years due to miniaturization of transfer patterns, and exposure lights such as F2 laser beams (157 nm) and EUV rays (5 to 20 nm) have been developed as alternatives to known exposure lights such as i lines (365 nm), KrF excimer laser beams (248 nm), and ArF excimer laser beams (193 nm). These short-wavelength exposure lights are readily absorbed into the above-described protective films, and therefore, the known method cannot be applied without modification.

Thus, methods including a step of carrying reticles while the reticles are accommodated in reticle cassettes (storage units) and a step of taking the reticles out of the reticle cassettes before exposure have been proposed. FIGS. 9A-B and 10A-B illustrate reticle cassettes disclosed in Japanese Patent Laid-Open No. 2005-123292 (corresponding to U.S. Patent Appl. No. 2005-095,829). The reticle cassette shown in FIGS. 9A-B includes a reticle-bearing portion 110 and a cover 120 such that a reticle 200 is interposed between and supported by the reticle-bearing portion 110 and the cover 120. Moreover, the reticle cassette shown in FIGS. 10A-B, which serves as a modification of the reticle cassette shown in FIGS. 9A-B, includes electrostatic adhesive portions 172 on the cover 120 such that the reticle 200 is supported by the cover 120 using the electrostatic adhesive portions. Such a reticle cassette is carried to an exposure chamber, and then the cover of the reticle cassette is removed from the reticle-bearing portion. Subsequently, the reticle 200 is taken out of the reticle cassette and then mounted on a reticle stage.

During carrying of the reticle, there is a high probability that particles are generated after the reticle is taken out of the reticle cassette.

For example, when the reticle is taken out of the reticle cassette using a robot hand, the reticle cassette and the reticle that are in contact with each other are first separated. Next, the reticle and the robot hand that are in contact with each other are separated when the reticle is transferred from the robot hand to an alignment stage for positioning the reticle. Furthermore, the reticle and the alignment stage that are in contact with each other are separated when the reticle is transferred from the alignment stage to the robot hand after positioning the reticle. Furthermore, the reticle and the robot hand that are in contact with each other are separated when the reticle is transferred from the robot hand to a reticle stage.

When the reticle is separated from substances that are in contact with the reticle, particles are generated by exfoliation, and the like. Thus, it is preferable that the number of contacts is kept to a minimum.

SUMMARY OF THE INVENTION

The present invention is directed to a reticle apparatus capable of reducing the generation of particles, an apparatus incorporating the reticle apparatus, a method of carrying a reticle, and a method of manufacturing devices.

According to one aspect of the present invention, a reticle cassette for an exposure apparatus using extreme ultraviolet rays includes a bearing portion and a cover. The bearing portion supports the reticle thereon and includes electrodes configured to attract using an electrostatic force and support a first surface of the reticle, the first surface having a pattern formed thereon. The reticle is accommodated in a space between the bearing portion and the cover.

According to the present invention, the reticle cassette can reduce the number of contacts and separations between the reticle and other substances during transfer of the reticle, and reduce the generation of particles.

Further features of the present invention will become apparent from the following description of exemplary embodiments with reference to the attached drawings.

DESCRIPTION OF THE EMBODIMENTS

First Exemplary Embodiment

Figure 1:
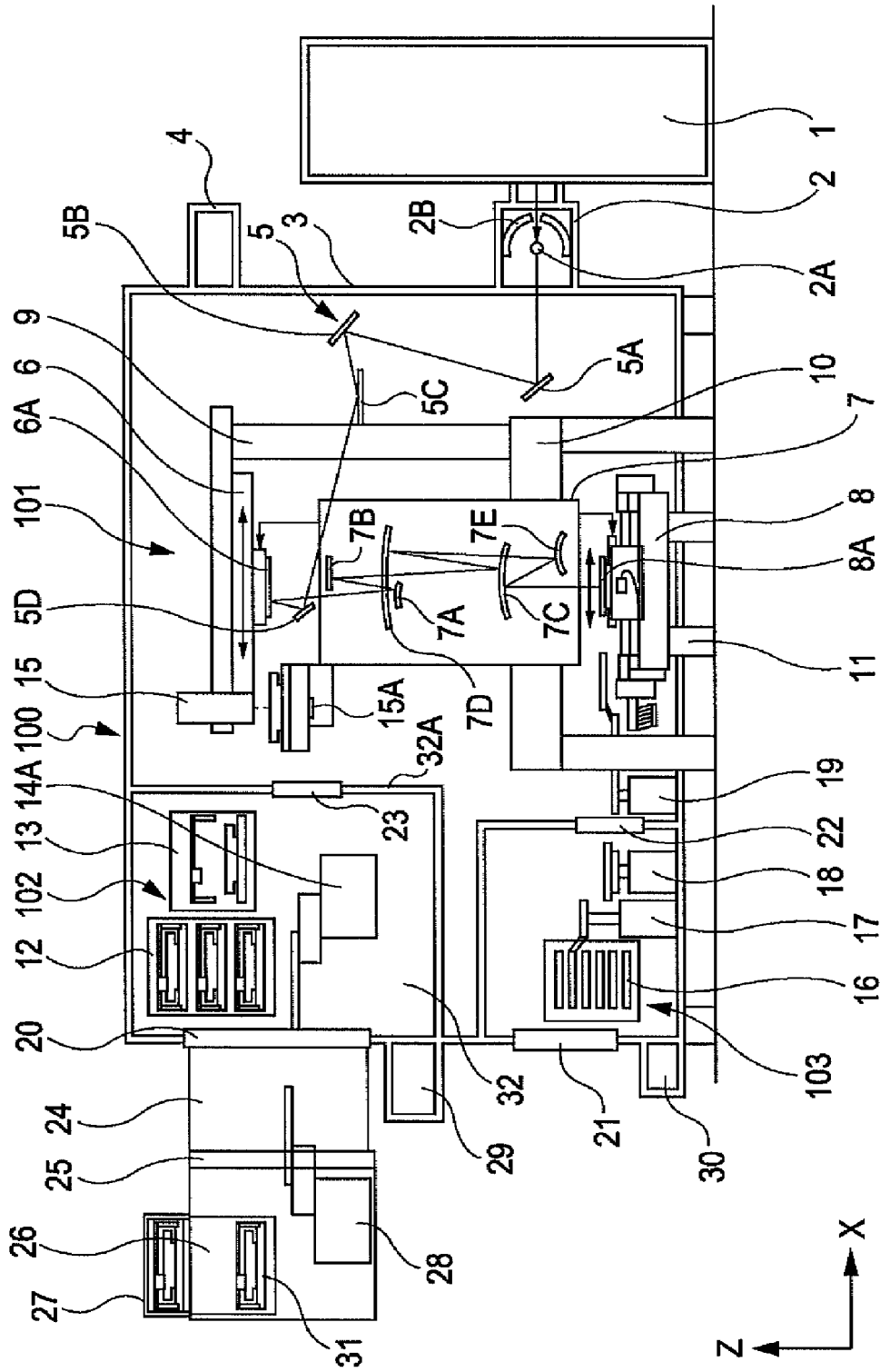
FIG. 1 illustrates an exposure apparatus according to an embodiment of the present invention.

An exposure apparatus will now be schematically described with reference to FIG. 1. The exposure apparatus includes a laser-generating unit 1 and a light-emitting unit 2 for generating exposure light, and a body 100 for exposure using the exposure light.

The laser beams generated in the laser-generating unit 1 are emitted to the light-emitting unit 2. The light-emitting unit 2 includes a light source 2A and a mirror 2B, and the interior of the light-emitting unit 2 is maintained in a vacuum. The light source 2A is composed of a gasified, liquefied, or atomized material, such as xenon. The laser, for example, a YAG solid-state laser, excites the atoms of the light-source material to produce a plasma. The mirror 2B can have a hemisphere shape having the light source 2A in the center, and aligns the directions of the light beams emitted from the light source 2A as a result of the excitation of the light source 2A to produce a plasma so as to concentrate the light beams. With this structure, exposure light is generated by emitting laser beams while the light-source material is ejected from a nozzle (not shown). The generated exposure light is guided to the body 100.

The body 100 includes a vacuum chamber 3, an exposing unit 101, a reticle-carrying unit 102, and a wafer-carrying unit 103 disposed inside the vacuum chamber 3.

First, the exposing unit 101 will be described. The vacuum chamber 3 maintains the interior thereof in a vacuum using a vacuum pump 4. The exposing unit 101 includes an illumination optical system 5, a reticle stage 6, a projection optical system 7, and a wafer stage 8.

The illumination optical system 5 includes a plurality of optical elements such as mirrors 5A to 5D. The illumination optical system 5 shapes and homogenizes the exposure light guided from the light-emitting unit 2 using these optical elements. The shaped and homogenized exposure light is guided to a reticle 6A mounted on the reticle stage 6.

The reticle stage 6 is movable in the direction of an arrow shown in the drawing using, for example, a linear motor. Moreover, the reticle stage 6 is supported by a reticle-stage support 9 at a predetermined position with respect to the floor. The reticle 6A has a pattern formed thereon, and the exposure light is reflected by the reticle 6A.

The projection optical system 7 includes a plurality of optical elements such as mirrors 7A to 7E. The projection optical system 7 reduces and projects the exposure pattern reflected from the reticle 6A onto a wafer 8A mounted on the wafer stage 8 using these optical elements. The projection optical system 7 is supported by a projection-system support 10 at a predetermined position with respect to the floor.

The wafer stage 8 is movable in the X, Y, Z, ωx (rotational direction about the X axis), ωy (rotational direction about the Y axis), and ωz (rotational direction about the Z axis) directions. The wafer stage 8 is driven by, for example, a linear motor. The wafer stage 8 is supported by a wafer-stage support 11 at a predetermined position with respect to the floor.

The relative positions of the reticle stage 6 and the wafer stage 8 with respect to the projection optical system 7 are measured by corresponding laser interferometers (not shown). The relative positions between the projection optical system 7 and these stages are maintained by controlling driving units of the corresponding stages on the basis of the measurement results. Moreover, the reticle-stage support 9, the projection-system support 10, and the wafer-stage support 11 each have a supporting mechanism (not shown) so as to be insulated from vibration of the floor.

Next, the reticle-carrying unit 102 will be described. The reticle-carrying unit 102 includes a reticle stocker 12, a reticle-carrying robot 14A, and a cover-operating unit 13. The reticle stocker 12 can store a plurality of reticle cassettes 31 each accommodating a reticle. With this, reticles having different patterns or used under different exposure conditions can be stored in the exposure apparatus.

The reticle-carrying robot 14A carries a reticle cassette including a reticle to be used for exposure from the reticle stocker 12 to the cover-operating unit 13. The cover-operating unit 13 removes the cover from the reticle cassette. The reticle-carrying robot 14A then carries the reticle cassette without the cover from the cover-operating unit 13 to an alignment stage 15A disposed below an alignment scope 15.

Figure 2A:
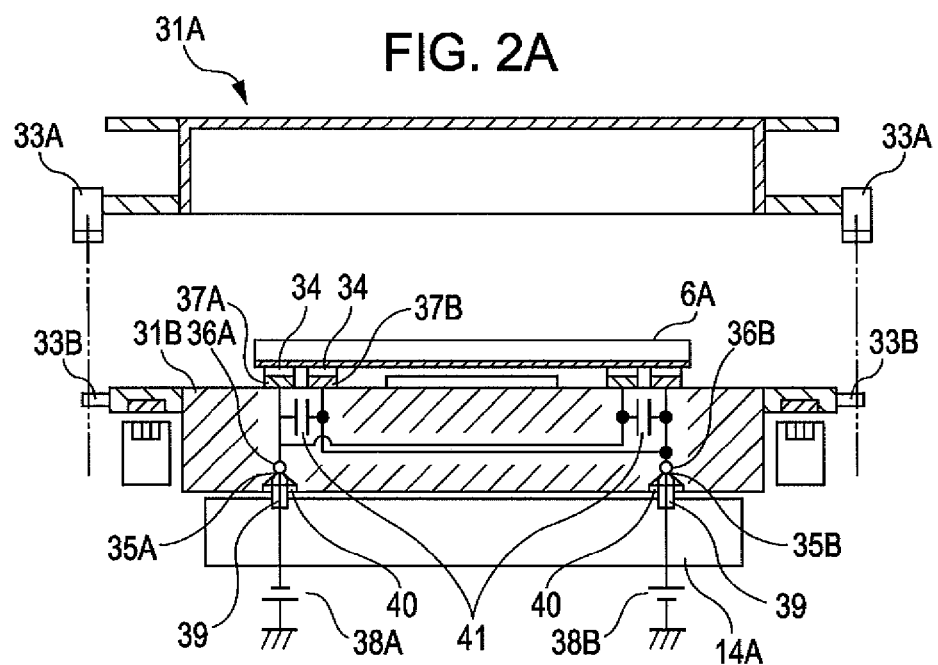
FIGS. 2A and 2B illustrate a reticle cassette when sending terminals are disposed in a reticle stocker.
Figure 2B:
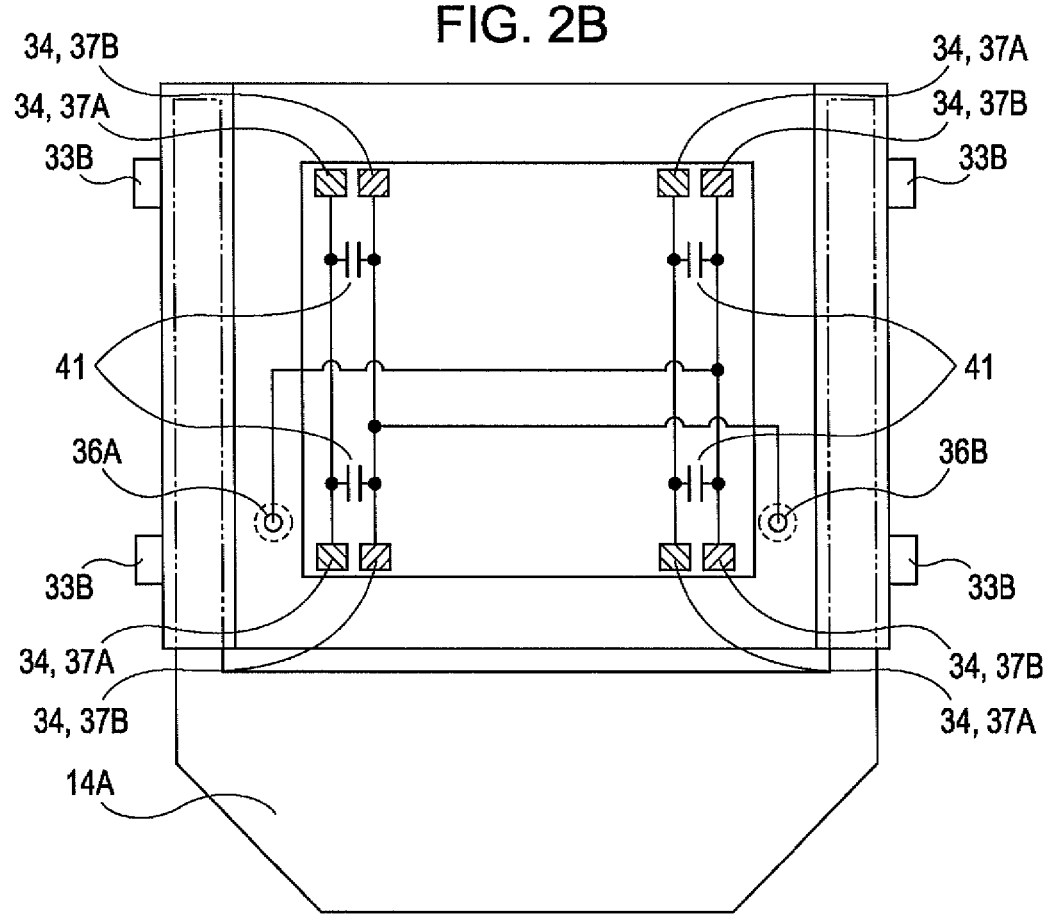

FIGS. 2A and 2B are schematic views of the reticle cassette 31. The lower surface of the reticle 6A in the drawing has a pattern, and the upper surface is plated with chromium. The reticle cassette 31 includes a cover 31A, a reticle-bearing portion 31B, and electrostatic chucks disposed on the reticle-bearing portion for attracting and maintaining the reticle 6A. The cover 31A and the reticle-bearing portion 31B include locking mechanisms 33A and 33B, respectively, such that the cover 31A is detachable. The locking mechanisms 33A and 33B may be mechanical clamps. However, the locking mechanisms 33A and 33B can be of a type using electromagnetic force so as to avoid the generation of particles caused by the friction between solids.

In this exemplary embodiment, the cover is convexed, and the reticle-bearing portion is flat. However, the shapes thereof are not limited to these. The cover may have any shape as long as the cover and the reticle-bearing portion form a space for accommodating a reticle, and may have, for example, an openable window.

The electrostatic chucks disposed on the reticle-bearing portion 31B each include adhesive portions 34 and electrodes 37A and 37B. The adhesive portions 34 can be composed of a dielectric such as ceramics. Moreover, the reticle-bearing portion 31B includes receiving terminals 36A and 36B for supplying charges to the electrodes 37A and 37B. Also, the reticle-bearing portion 31B includes charge-storage elements for storing charges to be supplied to the electrodes 37A and 37B. Capacitors 41 can be used as the charge-storage elements, although other components may be used as long as the components have similar functions. The capacitors 41 allow for stable charge supply even when the contacts between sending terminals 35A and 35B and the receiving terminals 36A and 36B, respectively, are cut. Moreover, no sending terminals are required of the reticle-carrying robot when the reticle stocker 12, an indexer 26, or the like has the sending terminals. Thus, no electrical wires need to be routed to the movable reticle-carrying robot, thereby controlling the effects of resistance generated by the bent wires and the generation of particles from the surfaces of the wires. This advantageously reduces the cost of manufacturing robot hands.

The reticle-bearing portion 31B is held by the reticle-carrying robot 14A while being carried. The reticle-bearing portion 31B can be held using an electromagnet in a noncontact manner so as to avoid the generation of particles caused by the friction between solids. The reticle-bearing portion 31B may or may not be held by mechanical clamps depending on the amount of particles allowed by the exposure apparatus.

Figure 3:
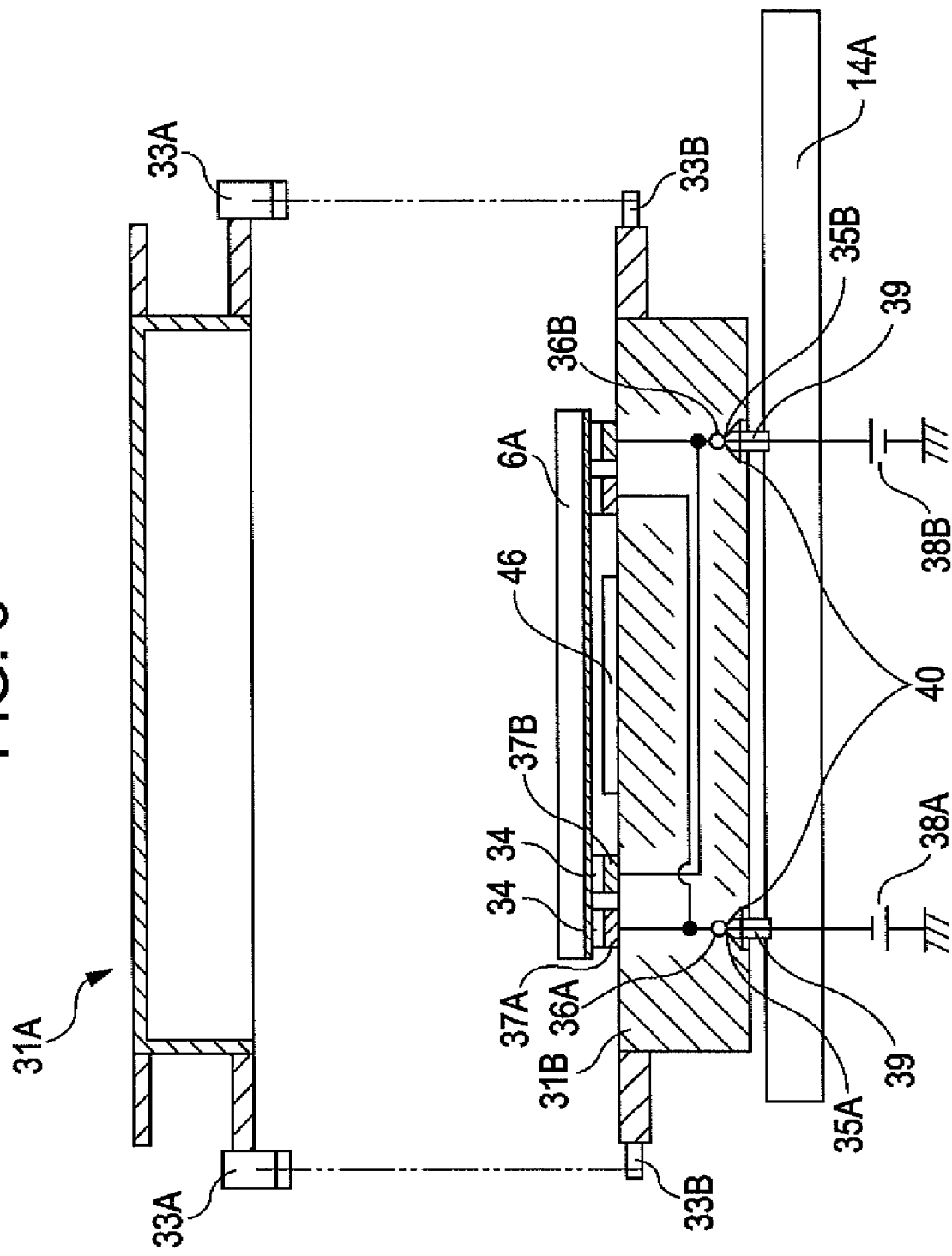
FIG. 3 illustrates a reticle cassette when the sending terminals are disposed in a robot hand.

FIG. 3 illustrates the reticle-carrying robot 14A including the sending terminals 35A and 35B. The sending terminals 35A and 35B are electrically connected with power supplies 38A and 38B, respectively. The sending terminals 35A and 35B and the receiving terminals 36A and 36B are positioned using corresponding positioning pins 39 and tapered portions 40, and are brought into contact with each other so as to charge the electrodes 37A and 37B. The positions of the sending terminals and the receiving terminals are not limited to those shown in the drawing.

In this exemplary embodiment, the electrodes 37A are positively charged, and the electrodes 37B are negatively charged. When the reticle is brought into contact with the electrodes, a conductive film on a surface (either the lower surface or the upper surface may suffice) of the reticle facing these electrodes is charged such that the reticle is attracted to the electrodes. The reticle does not need to be grounded by using bipolar electrostatic chucks.

The adhesive portions 34 are disposed so as to avoid the pattern of the reticle (FIG. 2B). The adhesive portions 34 may be freely arranged so as to regulate the deformation of the reticle and to obtain sufficient adhesion for preventing the displacement of the reticle.

The reticle on the reticle-bearing portion 31B carried to the alignment stage 15A is positioned using the alignment scope disposed above the alignment stage 15A. Specifically, the reticle is positioned such that a mark formed on the reticle is located within a predetermined range of a reference mark of the alignment scope.

After the alignment, the reticle-bearing portion 31B is carried from the alignment stage 15A to the reticle stage 6. At this time, the reticle-bearing portion 31B may be carried by the reticle-carrying robot 14A, but can be carried by a reticle-carrying robot 14B having higher carrying accuracy such that the reticle-bearing portion, on which the reticle after positioning is mounted, is carried with high accuracy. The reticle-bearing portion 31B is held by the reticle-carrying robot 14B while being carried. The reticle-bearing portion 31B can be held using electromagnets 44 and 45 in a noncontact manner so as to avoid the generation of particles caused by the friction between solids. The reticle-bearing portion 31B may or may not be held by mechanical clamps depending on the amount of particles allowed by the exposure apparatus.

Figure 4:
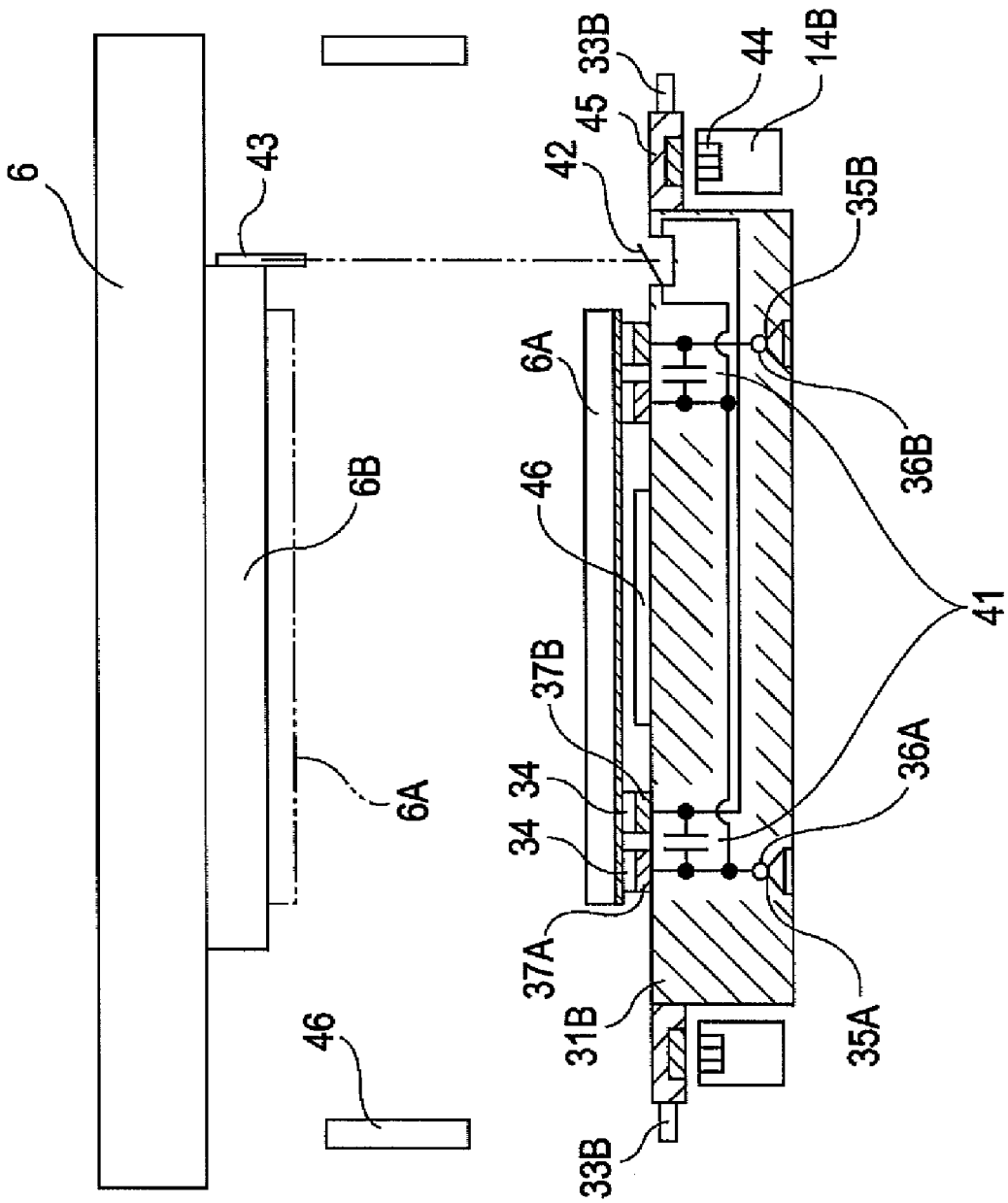
FIG. 4 illustrates a reticle-bearing portion carried to a reticle stage.

FIG. 4 illustrates the reticle-bearing portion 31B carried to the reticle stage 6. The reticle stage 6 includes an electrostatic chuck 6B for attracting the reticle 6A. The reticle-bearing portion 31B includes a discharge switch 42 for the capacitors for instantly removing the attractive force of the adhesive portions 34. Moreover, the reticle stage 6 includes a push pin 43 for turning the discharge switch 42 on. When the reticle-bearing portion 31B approaches the reticle stage 6, the switch is closed by the push pin 43, and the residual attractive force is instantly removed. At this time, the reticle is transferred to the charged electrostatic chuck disposed on the reticle stage 6. Methods for removing the attractive force are not limited to this, and may be performed in a noncontact manner so as to regulate the generation of particles.

Moreover, a particle collector 46 may be provided in the vicinity of the reticle-bearing portion 31B or the reticle stage 6. Particles existing between the reticle and the reticle-bearing portion 31B can be collected by the particle collector. An electrostatic precipitator, for example, may be used as the particle collector.

Thus, the possibility of friction between the reticle and other substances while the reticle is transferred to the reticle stage 6 is markedly reduced by holding the reticle on the reticle-bearing portion 31B using the electrostatic chucks. Removal of friction can control the generation of particles and the adhesion of the particles to the reticle, thereby reducing the number of device pattern defects.

In this exemplary embodiment, the reticle is held by the reticle-bearing portion 31B while the lower surface of the reticle adheres to the electrostatic chucks of the reticle-bearing portion, and is transferred to the reticle stage 6 such that the upper surface of the reticle adheres to the chuck of the reticle stage. With this structure, the generation of particles can be prevented since the reticle is not transferred from a robot hand to another. Moreover, the electrostatic chucks generate a force perpendicular to the holding surface, and therefore, the generation of friction can be prevented during release of the reticle, resulting in the generation of fewer particles. Since only the reticle can be transferred to the chuck of the reticle stage, the weight of the movable body including the stage should be no larger than necessary.

Moreover, the reticle is carried to the reticle stage 6 without coming into contact with the reticle-carrying robots since the reticle-bearing portion 31B, which is integrated with the reticle, is held and carried by the reticle-carrying robots. Thus, the generation of particles can be reduced. Furthermore, the reticle is fixed to the reticle-bearing portion by the electrostatic attraction while being carried. Thus, the generation of particles caused by the lateral friction between the reticle-bearing portion and the reticle can be reduced.

Moreover, the reticle cassette can be stored and carried without coming into contact with the upper surface of the reticle. Since the reticle is held by the electrostatic chuck of the reticle stage 6 at the upper surface thereof, foreign bodies adhering to the upper surface degrade the flatness of the reticle, and influence the exposure accuracy. According to the structure of the present invention, no objects come into contact with the upper surface of the reticle as described above, and thus the possibility of adherence of foreign bodies is reduced.

After the reticle is transferred to the reticle stage 6, the reticle-bearing portion 31B is carried to the cover-operating unit 13 by the reticle-carrying robot. The cover-operating unit 13 attaches the cover 31A to the reticle-bearing portion 31B. The reticle-carrying robot 14A then carries the reticle cassette having the cover attached thereto from the cover-operating unit 13 to the reticle stocker 12. The empty reticle cassette is stored in the reticle stocker 12.

In this exemplary embodiment, two or more cover-operating units 13 are used so as to support a multiple exposure process and to reduce the reticle-change time. Moreover, the reticle-carrying robot 14A is of a double-arm type so as to change reticles at high speed. The double-arm robot is a mechanism having two carrying hands. A case having two cover-operating units 13 and a double-arm reticle-carrying robot 14A will now be described.

During exposure, the reticle stocker 12 stores an empty reticle cassette, which contained the reticle that is being used for exposure. Then, a first hand of the reticle-carrying robot 14A takes this reticle cassette out of the reticle stocker 12, and carries the reticle cassette to a first cover-operating unit. The first cover-operating unit removes the cover from the reticle cassette, and the first hand carries a reticle-bearing portion P of the reticle cassette to the alignment stage. At this time, a second hand of the reticle-carrying robot 14A takes another reticle cassette, which contains a reticle to be used for the next exposure, out of the reticle stocker 12, and carries the reticle cassette to a second cover-operating unit. The second cover-operating unit removes the cover from the reticle cassette, and the second hand carries a reticle-bearing portion Q of the reticle cassette to the alignment stage.

After exposure, the reticle used for exposure is transferred to the reticle-bearing portion P, and the second hand carries the reticle-bearing portion Q to a reticle-transferring position. The first hand carries the reticle-bearing portion P to the first cover-operating unit. The first cover-operating unit attaches the cover to the reticle-bearing portion P, and the cover and the reticle-bearing portion P serving as a reticle cassette are carried to and stored in the reticle stocker 12. The second hand carries the reticle-bearing portion Q to the second cover-operating unit after the reticle is transferred to the reticle stage 6. The second cover-operating unit attaches the cover to the reticle-bearing portion Q, and the cover and the reticle-bearing portion Q serving as a reticle cassette are carried to and stored in the reticle stocker 12.

Herein, a space 32 in which the reticle stocker 12 and the reticle-carrying robot 14A are disposed (hereinafter referred to as a reticle-storage space) and a space in which exposure is performed (hereinafter referred to as an exposure space) is separated by a partition 32A. A gate valve 23 that is opened or closed during transfer of the reticle-bearing portion from/to the reticle stage 6 is disposed on the partition 32A. The reticle-storage space is maintained in a vacuum by a vacuum pump 29.

The cover-operating units of the reticle cassettes are disposed in a space separated from the exposure space, and the former space includes the exhausting unit for exhausting air form the space. Thus, gasses and particles discharged from the cover-operating units and the reticle carrying units do not have an effect on the exposure space.

Figure 5:
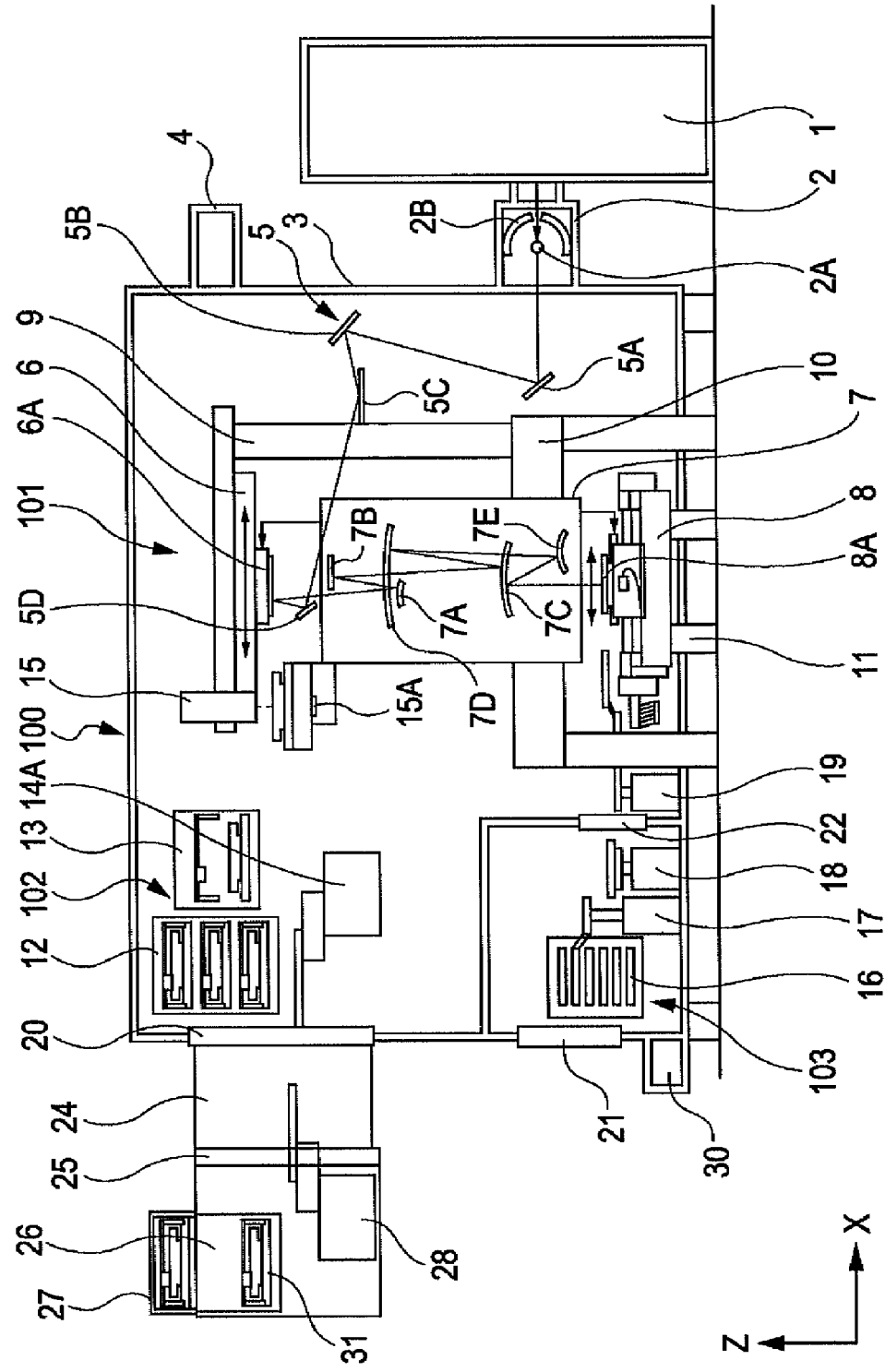
FIG. 5 illustrates a modification of the exposure apparatus.

FIG. 5 illustrates an example in which the reticle-storage space and the exposure space are integrated together. Such a structure may be permissible depending on the amount of particles allowed by the exposure apparatus.

Mechanisms for transferring a reticle cassette from outside the body 100 to the interior of the exposure apparatus will now be described with reference to FIG. 1. An airtight container 27 referred to as a standard mechanical interface (SMIF) pod is used for carrying a reticle cassette from outside the exposure apparatus. The SMIF pod 27 can retain a reticle cassette. Furthermore, a lifting unit 26 referred to as an indexer is used for opening or closing the SMIF pod 27 and drawing the reticle cassette accommodated in the pod into the interior of the exposure apparatus. The reticle cassette drawn into the interior of the exposure apparatus by the indexer 26 is carried to a load-lock chamber 24 by a reticle-carrying robot 28.

The load-lock chamber 24 includes a gate valve 25 adjacent to an atmospheric chamber (adjacent to the indexer 26) and a gate valve 20 adjacent to a vacuum chamber (adjacent to the reticle stocker 12). When the load-lock chamber is open to air, the gate valve 25 is opened while the gate valve 20 is closed. On the other hand, when the load-lock chamber is evacuated, the gate valve 20 is opened while the gate valve 25 is closed. At this time, the degree of vacuum in the exposure space is not reduced since the gate valve 23 is closed. The reticle-carrying robot 14A transfers the reticle cassette from the load-lock chamber 24 to the reticle stocker 12.

Figure 6:
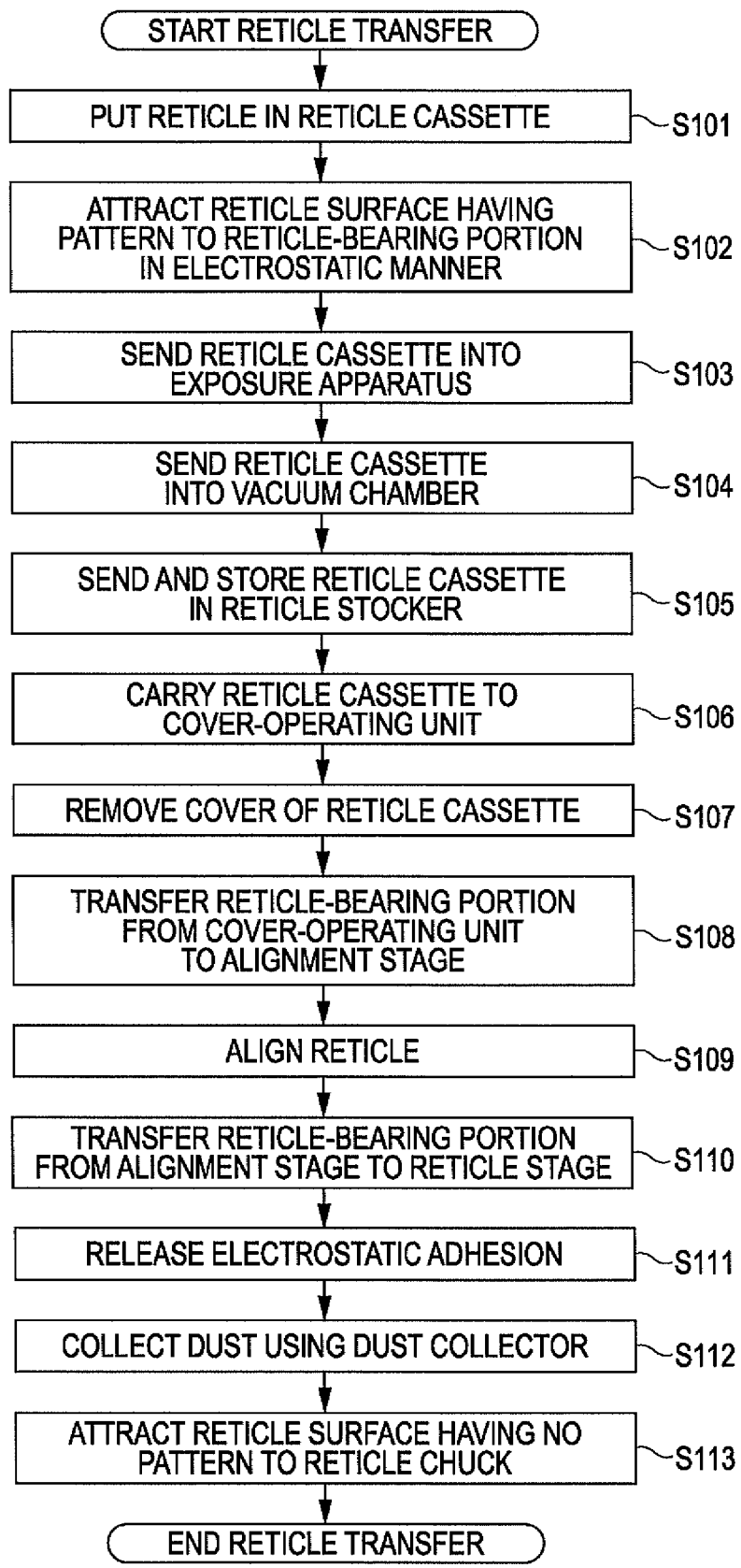
FIG. 6 is a flow chart illustrating a process of carrying a reticle.

FIG. 6 is a flow chart illustrating a process of carrying a reticle using the above-described exposure apparatus. In the following, the start of the reticle transfer is detailed. First, a reticle is put in a reticle cassette (Step S101). In the reticle cassette, the reticle is disposed such that the pattern surface thereof adheres to and is supported by the adhesive portions 34 of the reticle-bearing portion 31B in an electrostatic manner (Step S102). The reticle cassette is sent into the exposure apparatus using the indexer 26 (Step S103). The reticle cassette is sent into the vacuum chamber 3 via the load-lock chamber 24 (Step S104). The reticle cassette is sent into and stored in the reticle stocker (Step S105). The capacitors provided in the reticle-bearing portion of the reticle cassette may be charged by the sending terminals provided in the reticle stocker. Charge storage may be performed at units other than the reticle stocker. The reticle cassette is transferred from the reticle stocker to the cover-operating unit (Step S106). The cover of the reticle cassette is removed from the reticle-bearing portion by the cover-operating unit (Step S107).

The reticle-bearing portion is transferred from the cover-operating unit to the alignment stage (Step S108). The electrostatic adhesion of the reticle may be performed at any point in Steps S101 to S108. The reticle is aligned (Step S109). The reticle-bearing portion is transferred from the alignment stage to the reticle stage 6 (Step S110). The electrostatic adhesion of the reticle by the reticle-bearing portion is released (Step S111). Particles in the vicinity of the reticle are collected by the particle collector (Step S112). The reticle is transferred to the reticle chuck of the reticle stage so as to be supported by the reticle chuck at the surface having no pattern (Step S113). Thus, the reticle transfer is completed. After exposure, the reticle is held in the reticle cassette and is carried to the reticle stocker.

Next, the wafer-carrying unit 103 will be described. The wafer-carrying unit 103 includes a wafer stocker 16, a wafer-carrying robot 17, a pre-alignment portion 18, and a wafer-carrying hand 19. The wafer stocker 16 can store a plurality of wafers transferred from outside the body. When the wafers are transferred from outside the body to the wafer stocker 16, a gate valve 21 is opened or closed. The wafers may be transferred via a load-lock mechanism that is not shown in the drawings.

The wafer-carrying robot 17 transfers a wafer to be exposed to light from the wafer stocker 16 to the pre-alignment portion 18. The pre-alignment portion 18 includes a unit for roughly positioning the wafer in the rotational direction and a unit for adjusting the temperature of the wafer. A notch or an orientation flat formed in the wafer is used for positioning. The temperature of the wafer is adjusted to that of the exposure space. After the positioning and temperature adjustment, the wafer is transferred to the wafer stage by the wafer-carrying hand 19.

The space in which the wafer stocker 16 and the pre-alignment portion 18 are disposed (hereinafter referred to as the wafer-storage space) and the exposure space are separated by a partition. A gate valve 22 that is opened or closed during transfer of wafers from/to the wafer-storage space is disposed on the partition. The wafer-storage space is maintained in a vacuum by a vacuum pump 30.

In this manner, the number of contacts and separations between the reticle and other substances can be regulated, and thus the generation of particles can be reduced during carrying of the reticle.

In order to reduce the number of contacts between the reticle and other substances, a frame may be attached to the reticle while the reticle is carried and used for exposure. However, the reticle may be deformed by a force generated by the frame when the frame is fitted onto the reticle. In contrast, when the fitting accuracy is reduced, the reticle is displaced while being carried. The displacement of the reticle leads to the generation of particles due to the friction between the reticle and the frame.

Figure 7:
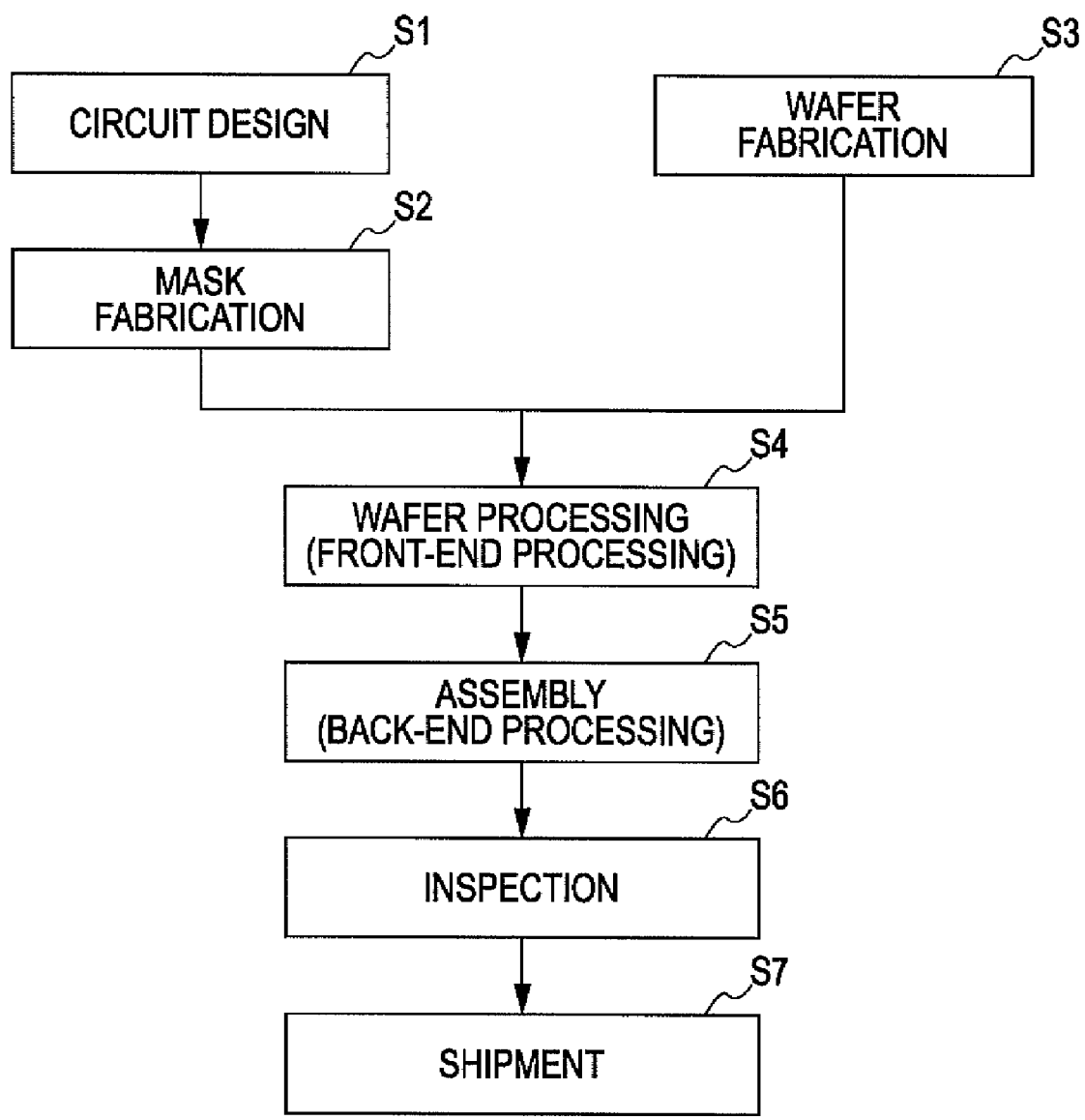
FIG. 7 is a flow chart illustrating a process of device fabrication using the exposure apparatus.

Next, a method for manufacturing devices (semiconductor chips such as integrated circuits (ICs) and large-scale integrated circuits (LSIs), liquid-crystal displays (LCDs), charge-coupled devices (CCDs), and the like) using the above-described exposure apparatus will be described with reference to FIGS. 7 and 8. FIG. 7 is a flow chart illustrating the device fabrication. Herein, a method for manufacturing semiconductor chips will be described as an example.

In Step S1 (circuit design), circuits of semiconductor devices are designed. In Step S2 (mask fabrication), masks are fabricated on the basis of circuit patterns designed in Step S1. In Step S3 (wafer fabrication), wafers are fabricated using materials such as silicon. Step S4 (wafer processing) is referred to as a front-end processing in which circuits are formed on the wafers by the above-described exposure apparatus using the masks and the wafers according to lithography technology. Step S5 (assembly) is referred to as a back-end processing in which semiconductor chips are fabricated using the wafers processed in Step S4, and includes assembly steps such as dicing, bonding, and packaging (molding). In Step S6 (inspection), operations, durability, and the like of the semiconductor devices fabricated in Step S5 are checked. The semiconductor devices fabricated through these steps are then shipped (Step S7).

Figure 8:
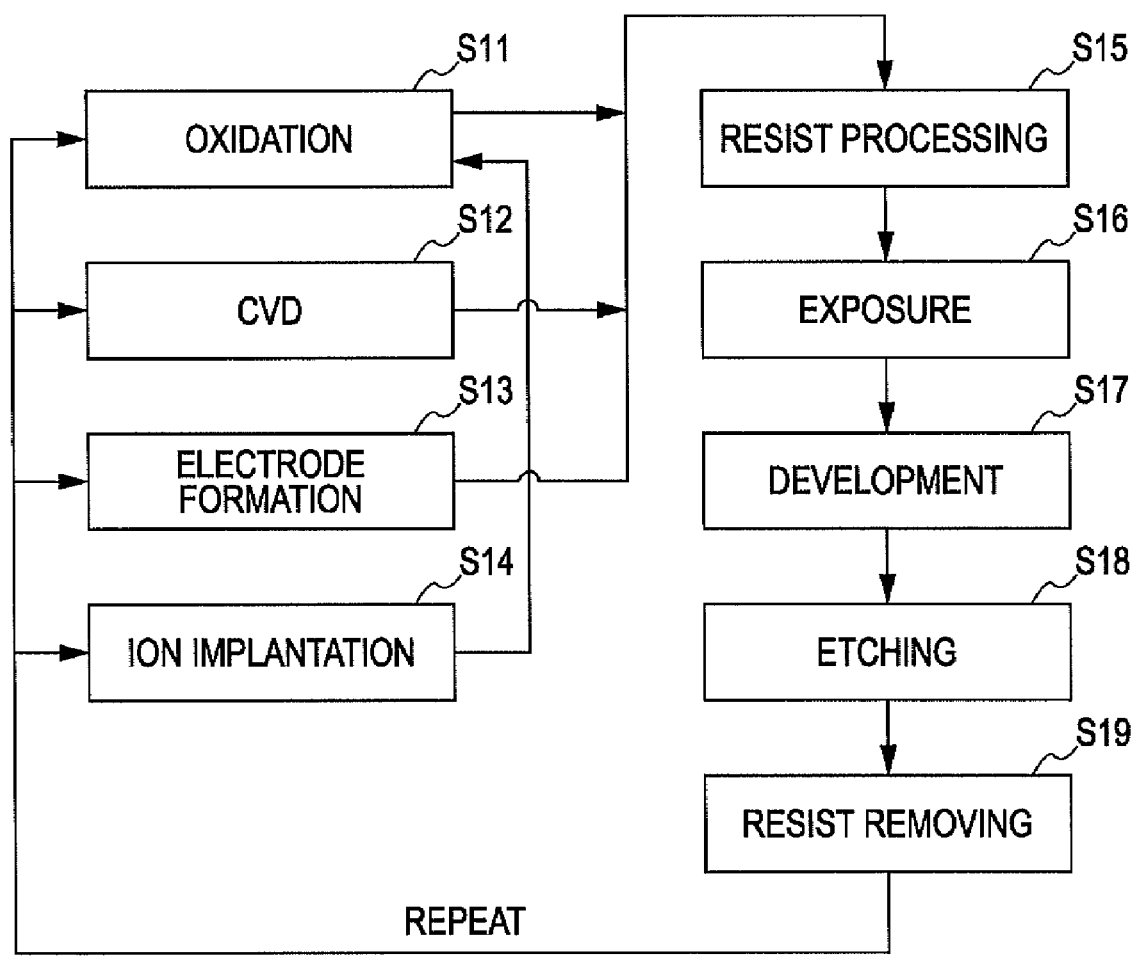
FIG. 8 is a flow chart illustrating wafer processing in Step S4 shown in the flow chart in FIG. 7 in detail.
Figure 9A:
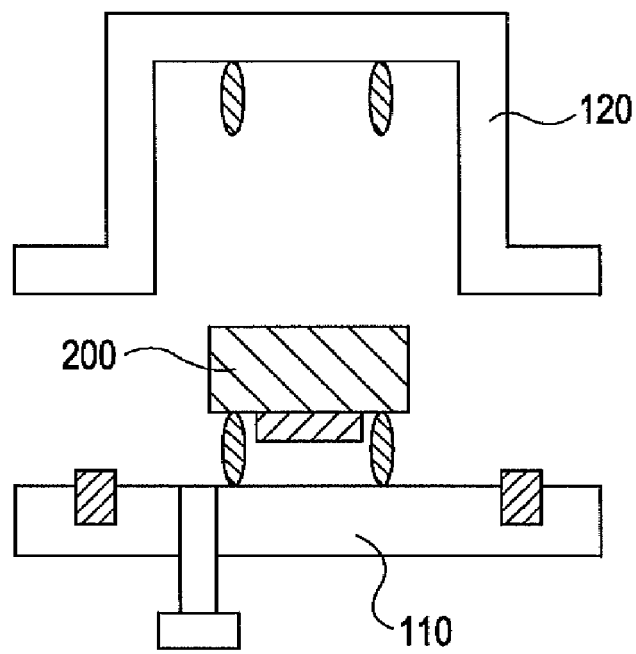
FIGS. 9A and 9B illustrate a known technology in which a reticle is interposed between and supported by a reticle-bearing portion and a cover of a reticle cassette.
Figure 9B:
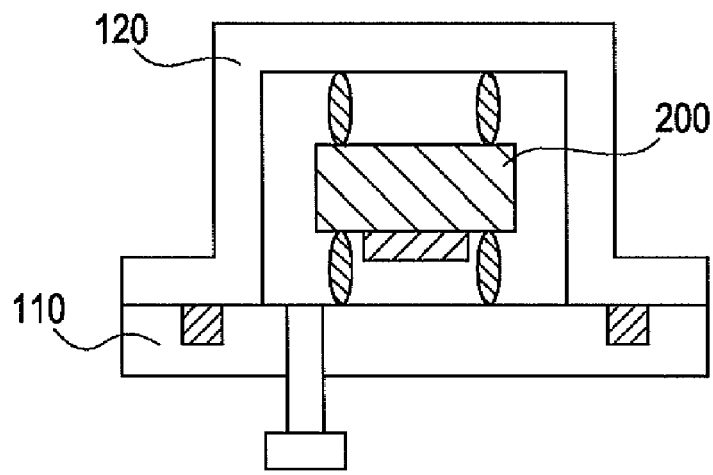
Figure 10A:
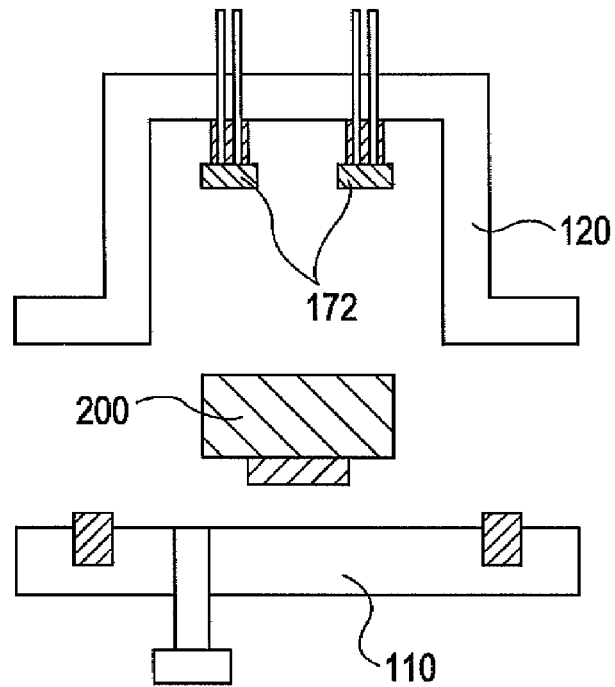
FIGS. 10A and 10B illustrate a known technology in which a reticle is supported by electrostatic chucks provided on a cover of a reticle cassette.
Figure 10B:
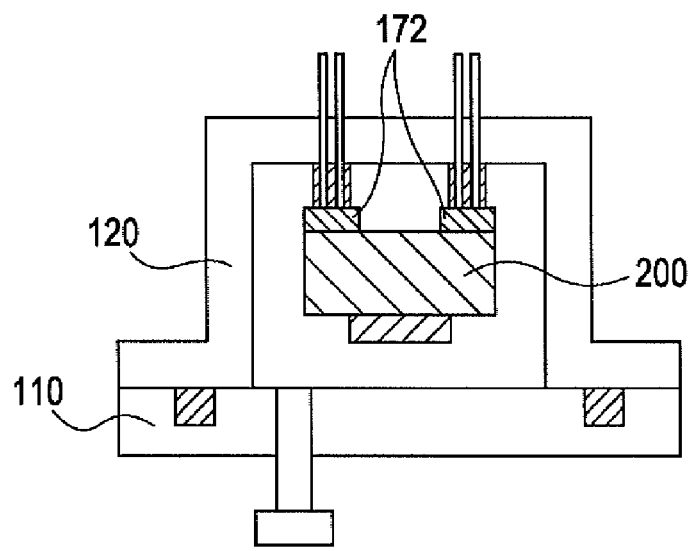

FIG. 8 is a flow chart illustrating the wafer processing in Step S4 in detail. In Step S11 (oxidation), the surfaces of the wafers are oxidized. In Step S12 (chemical vapor deposition; CVD), insulating films are deposited on the surfaces of the wafers. In Step S13 (electrode formation), electrodes are formed in the wafers. In Step S14 (ion implantation), ions are implanted in the wafers. In Step S15 (resist processing), a photosensitizer is applied to the wafers. In Step S16 (exposure), the wafers are exposed to light passing through the mask having a circuit pattern using the exposure apparatus. In Step S17 (development), the exposed wafers are developed. In Step S18 (etching), portions other than that of the developed resist image are removed. In Step S19 (resist removing), the resist no longer required after etching is removed. Repetition of these steps can form multiplex circuit patterns on the wafers.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the priority of Japanese Patent Application No. 2005-327568 filed Nov. 11, 2005, which is hereby incorporated by reference herein in its entirety.

What is claimed is:

1. A reticle cassette for an exposure apparatus using extreme ultraviolet rays, comprising:
    a bearing portion supporting a reticle thereon and including electrodes configured to attract using an electrostatic force, wherein with respect to a first surface of the reticle having a pattern thereon and a surface not having a pattern thereon, the bearing portion supports only the first surface of the reticle; and
    a cover,
    wherein the reticle is accommodated in a space between the bearing portion and the cover.

2. The reticle cassette according to claim 1, wherein the bearing portion includes a receiving terminal configured to supply charges to the electrodes.

3. The reticle cassette according to claim 1, wherein the portion includes a charge-storage element configured to store charges to be supplied to the electrodes.

4. The reticle cassette according to claim 1, wherein the bearing portion includes a particle-collecting unit configured to collect particles that exist between the supported reticle and the bearing portion.

5. An exposure apparatus comprising:
    a carrying unit configured to carry the reticle cassette according to claim 2, wherein
    the carrying unit includes a sending terminal configured to supply charges to the receiving terminal.

6. An exposure apparatus comprising:
    a storage unit configured to store the reticle cassette according to claim 2, wherein
    the storage unit includes a sending terminal configured to supply charges to the receiving terminal.

7. An exposure apparatus comprising the reticle cassette according to claim 1, wherein a reticle is carried via the reticle cassette.

8. A method for manufacturing devices, comprising:
    exposing wafers using the exposure apparatus according to claim 7; and
    developing the exposed wafers.

* * * * *